United States Patent [19]

Kato et al.

[11] 4,102,732

[45] Jul. 25, 1978

[54] METHOD FOR MANUFACTURING A SEMICONDUCTOR DEVICE

[75] Inventors: Taketoshi Kato; Masato Uchida, both of Yokohama; Kenichi Goto, Sagamihara, all of Japan

[73] Assignee: Tokyo Shibaura Electric Co., Ltd., Japan

[21] Appl. No.: 739,948

[22] Filed: Nov. 8, 1976

[30] Foreign Application Priority Data

Nov. 8, 1975 [JP] Japan .............................. 50-133599

[51] Int. Cl.² ......................................... H01L 21/306
[52] U.S. Cl. .................................... 156/645; 29/580; 148/187; 156/657
[58] Field of Search ................. 29/413, 414, 576, 580, 29/583; 156/655, 657, 659, 661, 662, 645; 148/187

[56] References Cited

U.S. PATENT DOCUMENTS

| | | | |
|---|---|---|---|
| 3,160,539 | 12/1964 | Hall et al. | 156/662 |
| 3,396,317 | 8/1968 | Vendelin | 29/576 E |
| 3,434,019 | 3/1969 | Carley | 29/577 X |
| 3,595,716 | 7/1971 | Kerr et al. | 29/578 X |

Primary Examiner—William A. Powell
Attorney, Agent, or Firm—Oblon, Fisher, Spivak, McClelland & Maier

[57] ABSTRACT

Semiconductor device elements are formed in a cavity portion on one main surface of a large diameter wafer, the cavity portion being protected by a frame body formed at the peripheral portion of the wafer. The semiconductor device elements are separated into individual semiconductor devices.

1 Claim, 12 Drawing Figures

METHOD FOR MANUFACTURING A SEMICONDUCTOR DEVICE

BACKGROUND OF THE INVENTION

1. Field of the Invention

This invention relates to a method for manufacturing a semiconductor device using a wafer having a large diameter.

2. Description of the Prior Art

Generally, a wafer having a diameter below 30mm$\phi$ is used for manufacturing such semiconductor devices as a semiconductor discrete device and a semiconductor integrated circuit. Recently with the advance of semiconductor technology, a wafer having a large diameter as 50mm$\phi$ or 70mm$\phi$ begins to be adopted. In the usual manufacturing of semiconductor devices, a thickness such as 230$\mu$, 280$\mu$, 330$\mu$, 380$\mu$ of the wafer is necessary corresponding to the diameter 40mm$\phi$, 50mm$\phi$, 60mm$\phi$, 75mm$\phi$ of the wafer respectively.

On the other hand, in the manufacturing process, it is necessary to handle the wafer with some tools, and the handling is usually made at the peripheral portion of the wafer. Accordingly, the stress applied to the wafer is increased in proportion to the diameter thereof, which often causes its mechanical destruction. Furthermore, for instance, in the manufacturing of semiconductor controlled rectifier (S.C.R.)consisting of four regions whose impurity type is alternatively different, the thickness of cathode, gate and anode regions are predetermined in characteristics regardness of the thickness of the wafer. Therefore, the middle region thereof becomes thick, which makes the forward characteristics low compared to a semiconductor device made of the 30mm$\phi$ wafer having a 160$\mu$ thickness. Considering mechanical strength, the thickness of the wafer having 40mm$\phi$ to 75mm$\phi$ is desired to be above 230$\mu$, and considering forward characteristics, the thickness is desired to be about 160$\mu$. However, practically, a 180mm$\phi$ wafer is used at the sacrifice of the forward characteristics and mechanical strength.

As above-mentioned, the large diameter tendency of the wafer brings an elimination of labor, however, in the other side, causes the lowering of the characteristics.

SUMMARY OF THE INVENTION

Accordingly, one object of this invention is to provide a method for manufacturing a semiconductor device with high yield.

Another object of this invention is to provide a method for manufacturing a semiconductor device without the destruction of the wafer in the manufacturing process.

Yet another object of this invention is to provide a method for manufacturing a semiconductor device specially suitable for the manufacturing of a semiconductor device using a large diameter wafer.

The method for manufacturing a semiconductor device according to this invention comprises the steps: forming a frame body at the peripheral portion of one surface of a wafer forming a cavity portion within said frame body, forming some semiconductor elements in said cavity portion, separating said semiconductor elements by piece.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Referring now to drawings, and more particularly to FIGS. 1, and 2A to 2J thereof, the present invention will now be particularly described with reference to a practical example.

Figure 1:
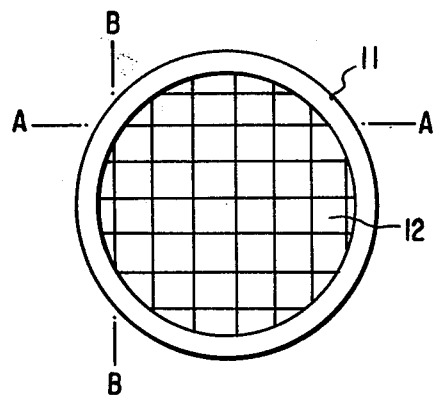
FIG. 1 is a plan view showing one embodiment of this invention.

According to this invention, as shown in FIG. 1, a wafer is etched, leaving the peripheral portion thereof forming a frame body 11, and many semiconductor device elements are made in the cavity portion 12.

Figure 2A:
FIGS. 2A to 2J are process views for explaining a method for manufacturing a semiconductor device.
Figure 2B:
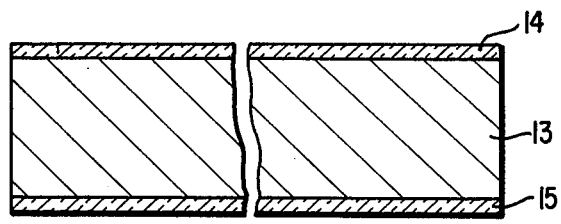
Figure 2C:
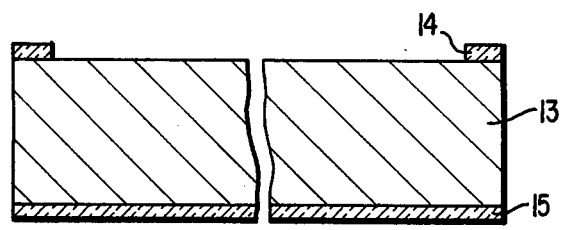
Figure 2D:
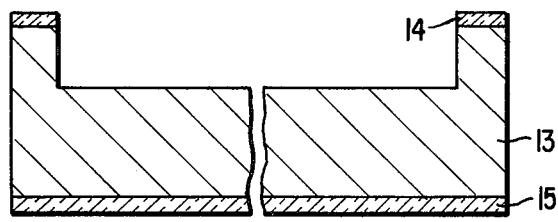

Explanation is made referring to SCR device as an example. As shown in FIG. 2A, in this embodiment on N type wafer 13 having 111 surface, a resistivity of 20$\Omega$cm, a thickness of 380$\mu$ and a diameter of 76mm$\phi$, made of the floating zone single crystal, is used. First, thermal oxide layer 14, 15 having about 4.5$\mu$ thickness is formed on both main surfaces of the wafer 13 as shown in FIG. 2B. Next, photoresist film is adhered to both surfaces of the wafer, and that on one surface is etched away leaving only the peripheral portion, and furthermore as shown in FIG. 2C the exposed thermal oxide layer is removed forming an aperture. Then, as shown in FIG. 2D, the exposed portion of the wafer is etched leaving the peripheral portion which forms a frame body, using an etchant consisting of HF, HNO$_3$ and CH$_3$COOH. In this embodiment, the thickness of the cavity portion of the wafer is about 160±1$\mu$.

Figure 2E:
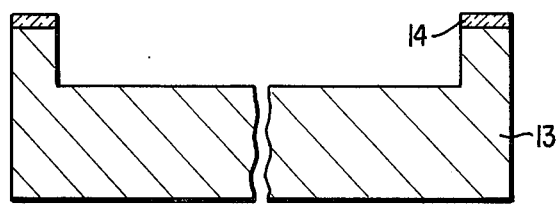
Figure 2F:
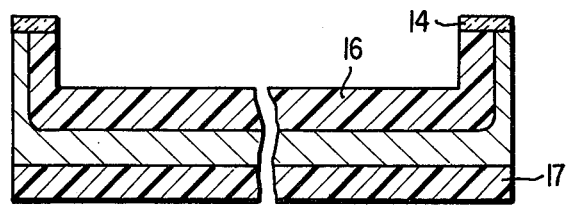
Figure 2G:
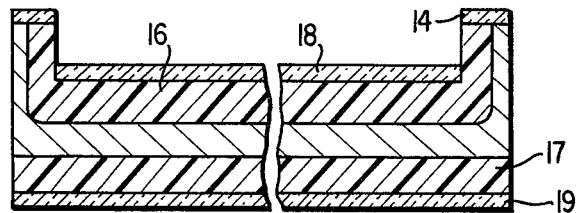
Figure 2H:
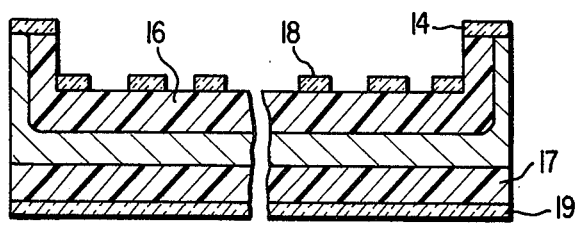
Figure 2I:
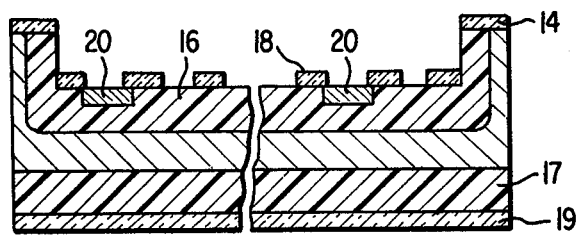
Figure 2J:
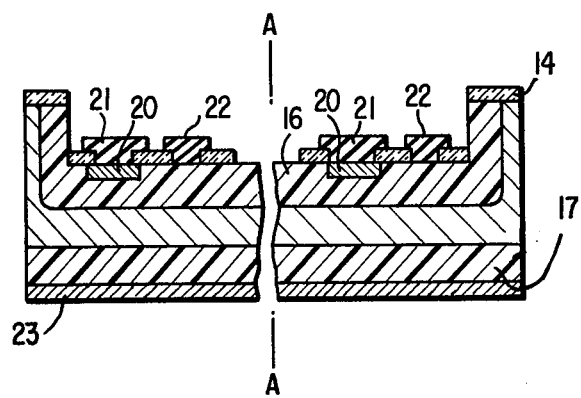

Using abovementioned wafer, many SCR device elements are formed regularly in the cavity portion as follows, namely, after removing the thermal oxide layer 15 as shown in FIG. 2E, P type gate region 16 and anode region 17 are formed diffusing Ga as an impurity as shown in FIG. 2F, successive thermal oxide layers 18 19 are grown on the cavity portion and the other main surface of the wafer, and some portions of thermal oxide layer 18 where cathode regions are to be formed are apertured as shown in FIG. 2H and phosphorus is diffused into the diffused region 16, using GaP as diffusion source as shown in FIG. 2I. Next, anode, gate and cathode electrodes 23, 21, 22 are formed.

This wafer including many SCR device elements is separated along dicing lines A—A, B—B to form discrete devices.

Figure 3:
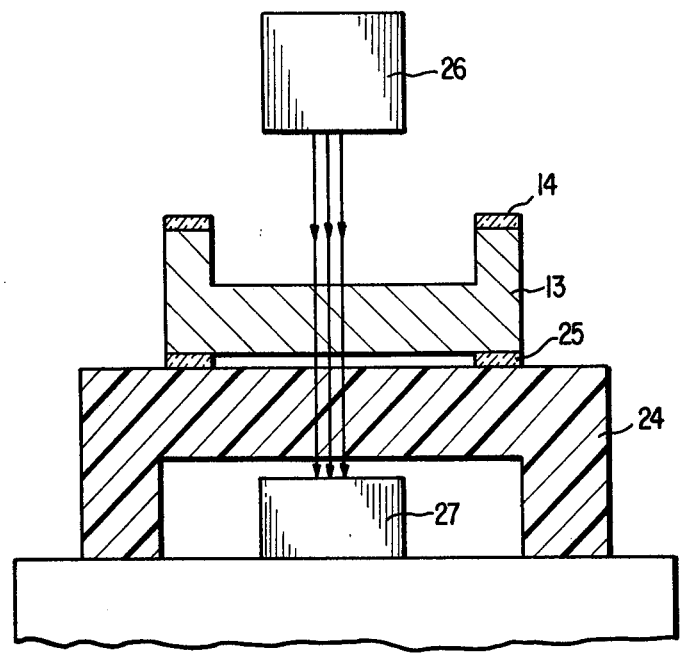
FIG. 3 is a sectional view showing a method for measuring the thickness of a wafer.

In above photo etching processes as shown in FIGS. 2G to 2J non contact mask is used to raise the photographic etching exposure accuracy. According to the non contact mask, the control of the forcus of the exposure is made easily by moving the contact mask, therefore the inaccuracy of the exposure in the cavity portion is prevented. Furthermore to measure the thickness of the cavity portion, an apparatus as shown in FIG. 3 is used. In this apparatus a wafer including a cavity portion is fitted to the glass substrate 24 using such wax 25 as Apiezon at the peripheral portion, and laser beam from a laser beam radiation apparatus 26 irradiates to the cavity portion and the absorption of the laser beam is measured using PbS or optoelectrical tube in the detector 27. In this apparatus, the laser beam passes through the glass substrate 24 without radiation decrement.

As above-mentioned, according to this invention, we can use a wafer having a large diameter, without lowering the characteristics or destroying the wafer in the manufacturing process.

Although this invention has been disclosed and illustrated with reference to particular applications, the principles involved are susceptible of numerous other applications which will be apparent to those skilled in the art. The invention is, therefore to be limited only as indicated by the scope of the appended claims.

WHAT IS CLAIMED AS NEW AND DESIRED TO BE SECURED BY LETTERS PATENT OF THE UNITED STATES IS:

1. A method for manufacturing semiconductor devices comprising:

coating the upper portion of a semiconductor wafer with a first thermal oxide layer and coating the lower portion of the semiconductor wafer with a second thermal oxide layer, removing a portion of the first thermal oxide layer to form a cavity therein, removing a portion of the upper portion of the semiconductor wafer to form a cavity surrounded by a peripheral frame, removing the second thermal oxide layer, forming a gate region in the cavity on the upper portion of the semiconductor wafer and forming an anode region on the lower portion of the semiconductor wafer, forming a third thermal oxide layer on the upper portion of the gate region and forming a fourth thermal oxide layer on the lower portion of the anode region, removing portions of the third thermal oxide layer to form apertures therein, forming diffused regions in the upper portion of the gate region below apertures in the third thermal oxide layer, forming gate electrodes above the diffused regions, forming cathode electrodes on the upper portion of the gate region within apertures in the third thermal oxide layer and forming an anode electrode on the bottom portion of the fourth thermal oxide layer, and separating the gate region, the semiconductor wafer, the anode region, the fourth thermal oxide layer and the anode electrode along a dicing line substantially perpendicular to the upper portion of the gate region.

* * * * *